(12) United States Patent
Khlat (10) Patent No.: US 10,630,375 B1
(45) Date of Patent: Apr. 21, 2020

(54) ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/273,288

(22) Filed: Feb. 12, 2019

Related U.S. Application Data (60) Provisional application No. 62/748,113, filed on Oct. 19, 2018.

(51) Int. Cl.
*H04B 1/04* (2006.01)
*H04B 7/155* (2006.01)
*H03F 1/02* (2006.01)

(52) U.S. Cl.
CPC ....... *H04B 7/15535* (2013.01); *H03F 1/0211* (2013.01); *H04B 1/04* (2013.01); *H04B 2001/0408* (2013.01)

(58) Field of Classification Search
CPC .......... H04B 7/15535; H04B 1/04; H04B 2001/0408; H03F 1/0211
USPC ................................. 455/522, 69
See application file for complete search history.

(56) References Cited

U.S. PATENT DOCUMENTS

| | | | | |
|---|---|---|---|---|
| 8,019,289 B2* | 9/2011 | Gorbachov | ............. | H04B 1/18 455/73 |
| 8,290,453 B2* | 10/2012 | Yoshihara | ................ | H01P 5/10 330/124 R |
| 8,385,859 B2* | 2/2013 | Hamano | ............... | H03F 1/0222 455/126 |
| 8,600,321 B2* | 12/2013 | Nambu | ................ | H04B 1/0475 455/127.1 |
| 8,611,402 B2* | 12/2013 | Chiron | .................. | H03F 1/0222 375/219 |
| 8,665,016 B2* | 3/2014 | Chowdhury | .......... | H03F 1/0222 330/127 |

(Continued)

OTHER PUBLICATIONS

Non-Final Office Action for U.S. Appl. No. 16/263,368, dated Dec. 26, 2019, 6 pages.

(Continued)

*Primary Examiner* — Hai V Nguyen
(74) *Attorney, Agent, or Firm* — Withrow & Terranova, P.L.L.C.

(57) ABSTRACT

An envelope tracking (ET) amplifier apparatus is provided. The ET amplifier apparatus includes a number of amplifier circuits that can be activated concurrently or selectively for amplifying a number of radio frequency (RF) signals. Notably, some amplifier circuits may amplify RF signals corresponding to a higher modulation bandwidth (e.g., >80 MHz), while other amplifier circuits may amplify RF signals corresponding to a lower modulation bandwidth (e.g., <40 MHz). In examples discussed herein, the ET amplifier apparatus can be flexibly configured to the amplifier circuits, either concurrently or selectively, to amplify the RF signals corresponding to a wide range of modulation bandwidths, without compromising linearity and efficiency of the amplifier circuits. Moreover, the ET amplifier apparatus may be configured to share a common circuit(s) among a number of circuits, thus helping to reduce footprint of the ET amplifier apparatus.

20 Claims, 7 Drawing Sheets

(56) References Cited

U.S. PATENT DOCUMENTS

| | | | | |
|---|---|---|---|---|
| 8,803,603 | B2 | 8/2014 | Wimpenny | |
| 8,816,272 | B1* | 8/2014 | Brown | H01J 49/24 |
| | | | | 250/282 |
| 8,818,305 | B1* | 8/2014 | Schwent | H03F 1/0227 |
| | | | | 455/127.5 |
| 8,921,774 | B1* | 12/2014 | Brown | H01J 49/26 |
| | | | | 250/282 |
| 8,942,651 | B2* | 1/2015 | Jones | H03F 1/0227 |
| | | | | 455/118 |
| 8,989,682 | B2* | 3/2015 | Ripley | H03F 3/245 |
| | | | | 455/127.1 |
| 9,002,303 | B2* | 4/2015 | Brobston | H03F 1/0266 |
| | | | | 455/127.1 |
| 9,065,509 | B1* | 6/2015 | Yan | H04B 1/0475 |
| 9,197,162 | B2* | 11/2015 | Chiron | H03F 1/02 |
| 9,197,256 | B2* | 11/2015 | Khlat | H03F 1/0227 |
| 9,246,460 | B2* | 1/2016 | Khlat | H03F 3/45663 |
| 9,247,496 | B2* | 1/2016 | Khlat | H04W 52/0209 |
| 9,287,829 | B2* | 3/2016 | Nobbe | H03F 1/0227 |
| 9,288,098 | B2* | 3/2016 | Yan | H04B 1/0475 |
| 9,294,043 | B2* | 3/2016 | Ripley | H03G 3/30 |
| 9,379,667 | B2* | 6/2016 | Khlat | H03G 3/3042 |
| 9,438,172 | B2* | 9/2016 | Cohen | H03F 1/0233 |
| 9,515,621 | B2* | 12/2016 | Hietala | H03F 1/0277 |
| 9,516,693 | B2* | 12/2016 | Khlat | H04W 52/0229 |
| 9,571,152 | B2* | 2/2017 | Ripley | H03F 3/19 |
| 9,596,110 | B2* | 3/2017 | Jiang | H03F 3/2173 |
| 9,614,476 | B2* | 4/2017 | Khlat | H03F 1/0222 |
| 9,614,477 | B1 | 4/2017 | Rozenblit et al. | |
| 9,641,206 | B2* | 5/2017 | Pratt | H04B 1/0475 |
| 9,671,801 | B2* | 6/2017 | Bhattad | G05F 1/563 |
| 9,743,357 | B2* | 8/2017 | Tabe | H04W 52/0245 |
| 9,831,834 | B2* | 11/2017 | Balteanu | H03F 1/0227 |
| 9,831,934 | B2 | 11/2017 | Kotecha et al. | |
| 9,843,294 | B2* | 12/2017 | Khlat | H03F 1/02 |
| 9,859,845 | B2* | 1/2018 | Sarbishaei | H03F 1/0222 |
| 9,912,296 | B1* | 3/2018 | Cheng | G05F 1/575 |
| 9,912,297 | B2* | 3/2018 | Khlat | H03F 1/0227 |
| 9,912,301 | B2* | 3/2018 | Xue | H03F 1/42 |
| 9,941,844 | B2* | 4/2018 | Khlat | H03F 1/02 |
| 9,948,240 | B2* | 4/2018 | Khlat | H03F 1/02 |
| 9,954,436 | B2* | 4/2018 | Khlat | H02M 3/07 |
| 9,960,737 | B1* | 5/2018 | Kovac | H03F 1/0266 |
| 9,974,050 | B2* | 5/2018 | Wiser | H03F 1/02 |
| 9,991,851 | B1* | 6/2018 | Khlat | H03F 3/245 |
| 9,991,913 | B1* | 6/2018 | Dinur | H04B 1/0475 |
| 10,003,303 | B2* | 6/2018 | Afsahi | H03F 3/45188 |
| 10,069,470 | B2* | 9/2018 | Khlat | H03F 3/19 |
| 10,090,809 | B1* | 10/2018 | Khlat | H03F 3/195 |
| 10,097,387 | B1* | 10/2018 | Wiser | H04B 1/0475 |
| 10,103,926 | B1* | 10/2018 | Khlat | H04B 1/1607 |
| 10,110,169 | B2* | 10/2018 | Khesbak | |
| 10,141,891 | B2* | 11/2018 | Gomez | H03G 3/3042 |
| 10,158,330 | B1* | 12/2018 | Khlat | H03F 1/0211 |
| 10,171,037 | B2* | 1/2019 | Khlat | H03F 1/0227 |
| 10,171,038 | B1* | 1/2019 | Chen | H03F 1/0227 |
| 10,181,826 | B2* | 1/2019 | Khlat | H03F 1/301 |
| 10,204,775 | B2* | 2/2019 | Brown | H01J 49/26 |
| 10,326,408 | B2* | 6/2019 | Khlat | H03F 1/0222 |
| 10,355,646 | B2* | 7/2019 | Lee | H03F 3/193 |
| 10,361,660 | B2* | 7/2019 | Khlat | H03F 1/0233 |
| 10,382,147 | B2* | 8/2019 | Ripley | H03F 1/30 |
| 10,396,716 | B2* | 8/2019 | Afsahi | H03F 3/213 |
| 10,419,255 | B2* | 9/2019 | Wiser | H04B 1/0475 |
| 10,432,145 | B2* | 10/2019 | Khlat | G01R 1/30 |
| 10,439,789 | B2* | 10/2019 | Brunel | H04L 27/36 |
| 10,454,428 | B2* | 10/2019 | Khesback | H03F 3/45183 |
| 10,476,437 | B2* | 11/2019 | Nag | H03F 3/189 |
| 2004/0100323 | A1 | 5/2004 | Khanifar | H03F 1/0244 |
| | | | | 330/51 |
| 2009/0253389 | A1* | 10/2009 | Ma | H03F 1/0222 |
| | | | | 455/118 |
| 2011/0223875 | A1* | 9/2011 | Hamano | H03F 1/0222 |
| | | | | 455/127.1 |
| 2012/0142304 | A1* | 6/2012 | Degani | H03F 1/025 |
| | | | | 455/343.1 |
| 2012/0194274 | A1* | 8/2012 | Fowers | H03F 1/0238 |
| | | | | 330/293 |
| 2012/0302179 | A1* | 11/2012 | Brobston | H03F 1/0266 |
| | | | | 455/73 |
| 2012/0309333 | A1* | 12/2012 | Nambu | H04B 1/0475 |
| | | | | 455/127.1 |
| 2013/0141159 | A1* | 6/2013 | Strange | H03G 1/0005 |
| | | | | 330/136 |
| 2013/0207731 | A1* | 8/2013 | Balteanu | H03F 1/02 |
| | | | | 330/296 |
| 2013/0285750 | A1* | 10/2013 | Chowdhury | H03F 1/0222 |
| | | | | 330/296 |
| 2014/0111279 | A1* | 4/2014 | Brobston | H03F 1/0222 |
| | | | | 330/286 |
| 2014/0306763 | A1* | 10/2014 | Hong | H03F 3/195 |
| | | | | 330/291 |
| 2014/0361837 | A1* | 12/2014 | Strange | H03F 1/0222 |
| | | | | 330/297 |
| 2015/0009980 | A1* | 1/2015 | Modi | H03F 3/245 |
| | | | | 370/338 |
| 2015/0091645 | A1* | 4/2015 | Park | H03F 3/2173 |
| | | | | 330/251 |
| 2015/0123628 | A1* | 5/2015 | Bhattad | G05F 1/563 |
| | | | | 323/266 |
| 2015/0194988 | A1* | 7/2015 | Yan | H04B 1/0475 |
| | | | | 375/297 |
| 2015/0236729 | A1* | 8/2015 | Peng | H04B 1/0475 |
| | | | | 455/114.3 |
| 2016/0036389 | A1* | 2/2016 | Balteanu | H03F 1/0216 |
| | | | | 330/252 |
| 2016/0094186 | A1* | 3/2016 | Cohen | H03F 1/0233 |
| | | | | 330/297 |
| 2016/0105151 | A1* | 4/2016 | Langer | H03F 1/0227 |
| | | | | 330/295 |
| 2016/0181995 | A1* | 6/2016 | Nentwig | H03F 3/211 |
| | | | | 330/295 |
| 2016/0204809 | A1* | 7/2016 | Pratt | H04B 1/04 |
| | | | | 375/219 |
| 2016/0294587 | A1* | 10/2016 | Jiang | H03F 3/2173 |
| 2017/0070199 | A1* | 3/2017 | Anderson | B82Y 10/00 |
| 2017/0077877 | A1* | 3/2017 | Anderson | B82Y 10/00 |
| 2017/0093340 | A1* | 3/2017 | Khesbak | H03F 1/0222 |
| 2017/0207802 | A1* | 7/2017 | Pratt | H04B 1/04 |
| 2017/0230924 | A1* | 8/2017 | Wolberg | H04W 56/004 |
| 2017/0279412 | A1* | 9/2017 | Afsahi | H03F 3/245 |
| 2017/0353287 | A1* | 12/2017 | Onaka | H04B 1/525 |
| 2018/0048276 | A1* | 2/2018 | Khlat | H03G 3/3036 |
| 2018/0138862 | A1* | 5/2018 | Balteanu | H03F 1/0227 |
| 2018/0138863 | A1* | 5/2018 | Khlat | H03F 3/245 |
| 2018/0159476 | A1* | 6/2018 | Balteanu | H03F 1/0222 |
| 2018/0159566 | A1* | 6/2018 | Dinur | H04B 1/0475 |
| 2018/0287564 | A1* | 10/2018 | Afsahi | H03F 3/245 |
| 2018/0309409 | A1* | 10/2018 | Khlat | H03F 1/0227 |
| 2018/0309414 | A1* | 10/2018 | Khlat | H03F 1/301 |
| 2018/0316440 | A1* | 11/2018 | Mita | H03F 1/0261 |
| 2018/0358930 | A1* | 12/2018 | Haine | H03F 1/0288 |
| 2019/0036493 | A1* | 1/2019 | Khlat | H03F 1/301 |
| 2019/0044480 | A1* | 2/2019 | Khlat | H03F 1/0211 |
| 2019/0089310 | A1* | 3/2019 | Khlat | H03F 3/189 |
| 2019/0097671 | A1* | 3/2019 | Dimpflmaier | H04B 1/44 |
| 2019/0109566 | A1* | 4/2019 | Folkmann | H03F 3/19 |
| 2019/0109613 | A1* | 4/2019 | Khlat | H04B 1/0475 |
| 2019/0115873 | A1* | 4/2019 | Khlat | H03F 1/0227 |
| 2019/0181804 | A1* | 6/2019 | Khlat | H03F 1/0233 |
| 2019/0222176 | A1* | 7/2019 | Khlat | H03F 3/245 |
| 2019/0222181 | A1* | 7/2019 | Khlat | H03F 3/19 |
| 2019/0267947 | A1* | 8/2019 | Khlat | H03F 3/24 |

OTHER PUBLICATIONS

Non-Final Office Action for U.S. Appl. No. 16/263,316, dated Dec. 23, 2019, 9 pages.

* cited by examiner

ENVELOPE TRACKING AMPLIFIER APPARATUS

RELATED APPLICATION

This application claims the benefit of U.S. provisional patent application No. 62/748,113, filed on Oct. 19, 2018, the disclosure of which is incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include an envelope tracking (ET) amplifier apparatus. The ET amplifier apparatus includes a number of amplifier circuits that can be activated concurrently or selectively for amplifying a number of radio frequency (RF) signals. Notably, some amplifier circuits may amplify RF signals corresponding to a higher modulation bandwidth (e.g., >80 MHz), while other amplifier circuits may amplify RF signals corresponding to a lower modulation bandwidth (e.g., <40 MHz). In examples discussed herein, the ET amplifier apparatus can be flexibly configured to the amplifier circuits, either concurrently or selectively, to amplify the RF signals corresponding to a wide range of modulation bandwidths, without compromising linearity and efficiency of the amplifier circuits. Moreover, the ET amplifier apparatus may be configured to share a common circuit(s) among a number of circuits, thus helping to reduce footprint of the ET amplifier apparatus.

In one aspect, an ET amplifier apparatus is provided. The ET amplifier apparatus includes a distributed ET amplifier circuit. The distributed ET amplifier circuit includes a first amplifier circuit configured to amplify an RF signal based on a first ET voltage. The distributed ET amplifier circuit also includes a first ET circuit configured to generate the first ET voltage. The distributed ET amplifier circuit also includes a second amplifier circuit configured to amplify the RF signal based on a second ET voltage. The distributed ET amplifier circuit also includes a second ET circuit configured to generate the second ET voltage. The ET amplifier apparatus also includes a first auxiliary amplifier circuit configured to amplify a first RF signal based on a first auxiliary voltage. The ET amplifier apparatus also includes a second auxiliary amplifier circuit configured to amplify a second RF signal based on a second auxiliary voltage. The ET amplifier apparatus also includes an ET integrated circuit (ETIC). The ETIC is configured to cause at least one ET circuit among the first ET circuit and the second ET circuit to provide at least one ET voltage among the first ET voltage and the second ET voltage to at least one amplifier circuit among the first amplifier circuit and the second amplifier circuit in response to determining that the at least one amplifier circuit is activated. The ETIC is also configured to provide at least one auxiliary voltage among the first auxiliary voltage and the second auxiliary voltage to at least one auxiliary amplifier circuit among the first auxiliary amplifier circuit and the second auxiliary amplifier circuit in response to determining that the at least one auxiliary amplifier circuit is activated.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) amplifier apparatus. The ET amplifier apparatus includes a number of amplifier circuits that can be activated concurrently or selectively for amplifying a number of radio frequency (RF) signals. Notably, some amplifier circuits may amplifier RF signals corresponding to a higher modulation bandwidth (e.g., >80 MHz), while other amplifier circuits may amplify RF signals corresponding to a lower modulation bandwidth (e.g., <40 MHz). In examples discussed herein, the ET amplifier apparatus can be flexibly configured to the amplifier circuits, either concurrently or selectively, to amplify the RF signals corresponding to a wide range of modulation bandwidths, without compromising linearity and efficiency of the amplifier circuits. Moreover, the ET amplifier apparatus may be configured to share a common circuit(s) among a number of circuits, thus helping to reduce footprint of the ET amplifier apparatus.

Figure 1:
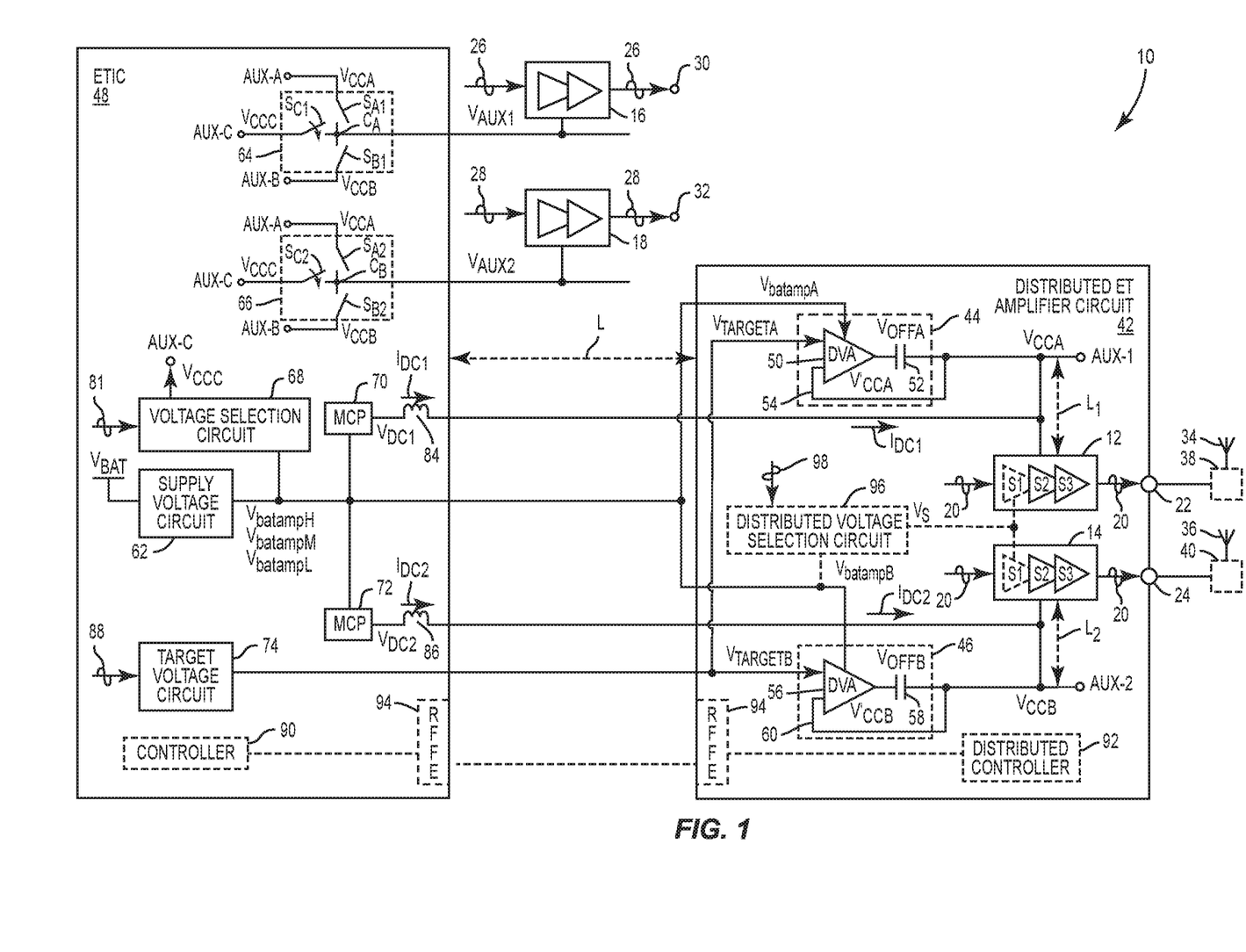
FIG. 1 is a schematic diagram of an exemplary envelope tracking (ET) amplifier apparatus configured according to an embodiment of the present disclosure to support concurrent transmission in multiple radio frequency (RF) bands.

FIG. 1 is a schematic diagram of an exemplary ET amplifier apparatus 10 configured according to an embodiment of the present disclosure to support concurrent transmission in multiple RF bands. The ET amplifier apparatus 10 includes a first amplifier circuit 12, a second amplifier circuit 14, a first auxiliary amplifier circuit 16, and a second auxiliary amplifier circuit 18. The first amplifier circuit 12 and the second amplifier circuit 14 are configured to amplify an RF signal 20 based on a first ET voltage $V_{CCA}$ and a second ET voltage $V_{CCB}$ for concurrent multiple-input multiple-output (MIMO) transmission in a first RF band via a first antenna port 22 and a second antenna port 24, respectively.

The first auxiliary amplifier circuit 16 and the second auxiliary amplifier circuit 18 are configured to amplify a first RF signal 26 based on a first auxiliary voltage $V_{AUX1}$ and a second RF signal 28 based on a second auxiliary voltage $V_{AUX2}$ for concurrent transmission in a second RF band via a first auxiliary antenna port 30 and a second auxiliary antenna port 32, respectively. In a non-limiting example, the first RF signal 26 can be identical to the second RF signal 28. In this regard, the first RF signal 26 and the second RF signal 28 are provided to the first auxiliary antenna port 30 and the second auxiliary antenna port 32 for concurrent MIMO transmission in the second RF band. Thus, the ET amplifier apparatus 10 can support concurrent MIMO transmissions in the first RF band and the second RF band.

In a non-limiting example, the RF signal 20, the first RF signal 26, and the second RF signal 28 are Wi-Fi signals encoded based on the Institute of Electrical and Electronics Engineers (IEEE) 802.11 standards. For example, the RF signal 20 is encoded in accordance to the IEEE 802.11ac standard for transmission in a 5 GHz RF band, while the first RF signal 26 and the second RF signal 28 are encoded in accordance to the IEEE 802.11n standard for transmission in a 2.4 GHz RF band. In this regard, the ET amplifier apparatus 10 can be configured to support concurrent Wi-Fi MIMO transmissions in both the 2.4 GHz and the 5 GHz RF bands.

The first antenna port 22 and the second antenna port 24 may be coupled to a first antenna 34 and a second antenna 36, which may be shared by another amplifier circuit (not shown) configured to transmit RF signals encoded in fifth-generation new-radio (5G-NR) communication standards in 5G-NR RF bands (e.g., band n77/n79). In this regard, the first antenna port 22 and the second antenna port 24 may be coupled to the first antenna 34 and the second antenna 36 via a first coupler 38 and a second coupler 40, respectively.

Notably, the first coupler 38 may introduce a certain amount of insertion loss between the first antenna port 22 and the first antenna 34. Likewise, the second coupler 40 may introduce a certain amount of insertion loss between the second antenna port 24 and the second antenna 36. As such, the first amplifier circuit 12 and the second amplifier circuit 14 may need to amplify the RF signal 20 to a higher power (e.g., +2 dBm) to help compensate for the insertion losses introduced by the first coupler 38 and the second coupler 40. Furthermore, the RF signal 20 may be modulated at a higher modulation bandwidth (e.g., >80 MHz). As such, the first amplifier circuit 12 and/or the second amplifier circuit 14 may be susceptible to trace-inductance related distortions in the first ET voltage $V_{CCA}$ and/or the second ET voltage $V_{CCB}$. In contrast, the first RF signal 26 and the second RF signal 28 may be modulated at a lower modulation bandwidth (e.g., <40 MHz). As a result, the first auxiliary amplifier circuit 16 and/or the second auxiliary amplifier circuit 18 may be less susceptible to trace-inductance related distortions in the first auxiliary voltage $V_{AUX1}$ and/or the second auxiliary voltage $V_{AUX2}$. As such, it may be necessary to optimize overall architecture of the ET amplifier apparatus 10 to minimize trace-inductance related distortions in the first ET voltage $V_{CCA}$ and the second ET voltage $V_{CCB}$, without increasing complexity and footprint of the ET amplifier apparatus 10.

In this regard, the ET amplifier apparatus 10 is configured to include a distributed ET amplifier circuit 42, in which the first amplifier circuit 12 and the second amplifier circuit 14 are provided. The distributed ET amplifier circuit 42 includes a first ET circuit 44 and a second ET circuit 46 configured to generate the first ET voltage $V_{CCA}$ and the second ET voltage $V_{CCB}$, respectively. In a non-limiting example, the first ET circuit 44 and the second ET circuit 46 are coupled to the first amplifier circuit 12 and the second amplifier circuit 14 over a first conductive length $L_1$ and a second conductive length $L_2$, respectively. Each of the first conductive length $L_1$ and the second conductive length $L_2$ corresponds to a respective trace inductance of less than four-tenths (0.4) nanoHenry (nH). By collocating the first amplifier circuit 12, the first ET circuit 44, the second amplifier circuit 14, and the second ET circuit 46 in the distributed ET amplifier circuit 42, it may be possible to reduce trace-inductance related distortions in the first ET voltage $V_{CCA}$ and the second ET voltage $V_{CCB}$, thus helping to improve efficiency and linearity of the first amplifier circuit 12 and the second amplifier circuit 14, particularly when the RF signal 20 is modulated at the higher modulation bandwidth and/or amplified to the higher power.

The ET amplifier apparatus 10 includes an ET integrated circuit (ETIC) 48, which may be coupled to the distributed ET amplifier circuit 42 over a conductive length L that corresponds to greater than 0.4 nH trace inductance. In this regard, the ETIC 48 and the distributed ET amplifier circuit 42 are separate circuits that may be provided on opposite ends of a form factor. The ETIC 48 may be provided as an independent circuit or being integrated with a transceiver circuit.

The ETIC 48 may be configured to function as a main control entity in the ET amplifier apparatus 10. For example, the ETIC 48 can be configured to control both the distributed ET amplifier circuit 42, the first auxiliary amplifier circuit 16, and/or the second auxiliary amplifier circuit 18. In this regard, the ETIC 48 can be configured to activate at least one amplifier circuit among the first amplifier circuit 12 and the second amplifier circuit 14 in the distributed ET amplifier circuit 42. Accordingly, the ETIC 48 may be configured to cause at least one ET circuit among the first ET circuit 44 and the second ET circuit 46 to provide at least one ET voltage among the first ET voltage $V_{CCA}$ and the second ET voltage $V_{CCB}$ to the activated amplifier circuit. Likewise, the ETIC 48 may activate at least one auxiliary amplifier circuit among the first auxiliary amplifier circuit 16 and the second auxiliary amplifier circuit 18. Accordingly, the ETIC 48 may provide at least one auxiliary voltage among the first auxiliary voltage $V_{AUX1}$ and the second auxiliary voltage $V_{AUX2}$ to the activated auxiliary amplifier circuit.

The first ET circuit 44 includes a first distributed voltage amplifier 50 (denoted as "DVA") configured to generate a first initial ET voltage $V'_{CCA}$ based on a first supply voltage $V_{batampA}$ and a first ET target voltage $V_{TARGETA}$. The first ET circuit 44 may include a first offset capacitor 52 that couples the first distributed voltage amplifier 50 to the first amplifier circuit 12 and a first auxiliary port AUX-A. The first offset capacitor 52 is configured to raise the first initial ET voltage $V'_{CCA}$ by a first offset voltage $V_{OFFA}$ (e.g., 0.8V) to generate the first ET voltage $V_{CCA}$ ($V_{CCA}=V'_{CCA}+V_{OFFA}$) at the first amplifier circuit 12 and the first auxiliary port AUX-A. The first ET circuit 44 may include a first feedback loop 54 configured to provide a copy of the first ET voltage $V_{CCA}$ back to the first distributed voltage amplifier 50.

Similarly, the second ET circuit 46 includes a second distributed voltage amplifier 56 (denoted as "DVA") configured to generate a second initial ET voltage $V'_{CCB}$ based on a second supply voltage $V_{batampB}$ and a second ET target voltage $V_{TARGETB}$. The second ET circuit 46 may include a second offset capacitor 58 that couples the second distributed voltage amplifier 56 to the second amplifier circuit 14 and a second auxiliary port AUX-B. The second offset capacitor 58 is configured to raise the second initial ET voltage $V'_{CCB}$ by a second offset voltage $V_{OFFB}$ (e.g., 0.8V) to generate the second ET voltage $V_{CCB}$ ($V_{CCB}=V'_{CCB}+V_{OFFB}$) at the second amplifier circuit 14 and the second auxiliary port AUX-B. The second ET circuit 46 may include a second feedback loop 60 configured to provide a copy of the second ET voltage $V_{CCB}$ back to the second distributed voltage amplifier 56.

The ETIC 48 includes a supply voltage circuit 62, a first auxiliary interface circuit 64, a second auxiliary interface circuit 66, a voltage selection circuit 68, a first multi-level charge pump (MCP) 70, a second MCP 72, and a target voltage circuit 74. The supply voltage circuit 62 is configured to generate a number of supply voltages $V_{batampH}$, $V_{batampM}$, and $V_{batampL}$ ($V_{batampH}>V_{batampM}>V_{batampL}$) based on a battery voltage $V_{BAT}$. The voltage selection circuit 68 is coupled between the supply voltage circuit 62 and a third auxiliary port AUX-C. The voltage selection circuit 68 is configured to generate a constant auxiliary voltage $V_{CCC}$ at the third auxiliary port AUX-C.

Figure 2:
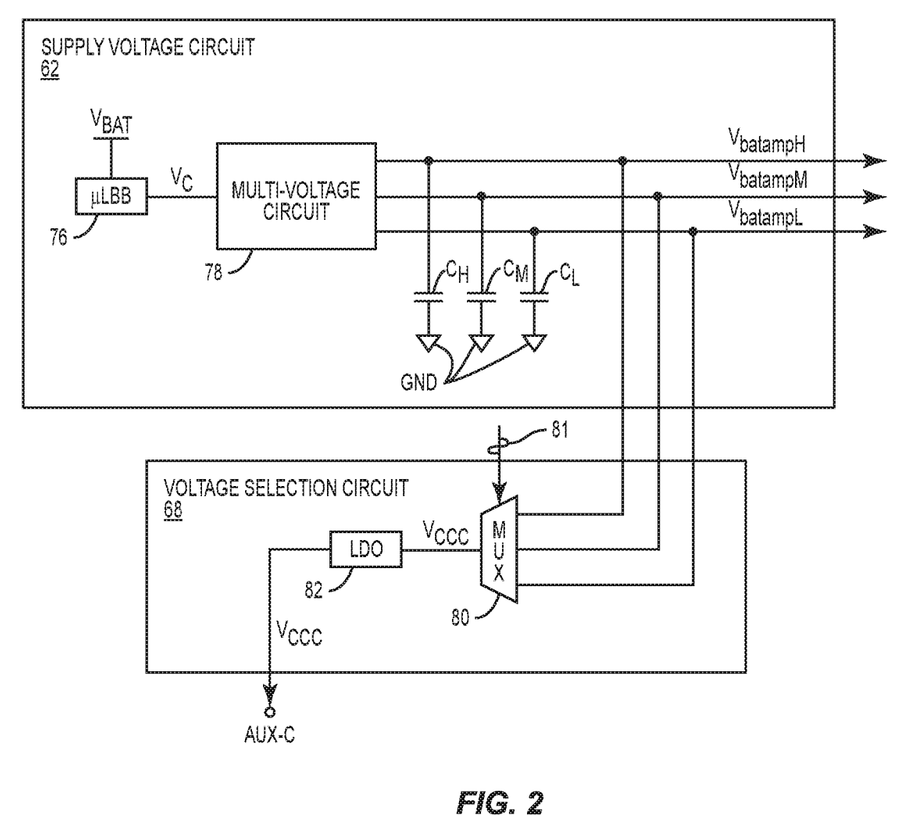
FIG. 2 is a schematic diagram providing an exemplary illustration of a supply voltage circuit and a voltage selection circuit in the ET amplifier apparatus of FIG. 1.

In this regard, FIG. 2 is a schematic diagram providing an exemplary illustration of the supply voltage circuit 62 and the voltage selection circuit 68 in the ET amplifier apparatus 10 of FIG. 1. Common elements between FIGS. 1 and 2 are shown therein with common element numbers and will not be re-described herein.

The supply voltage circuit 62 includes a micro inductor-based buck-boost (μLBB) circuit 76 configured to generate a constant voltage $V_C$ based on the battery voltage $V_{BAT}$. The μLBB circuit 76 may operate in a buck mode to generate the constant voltage $V_C$ at the battery voltage $V_{BAT}$ or in a boost mode to generate the constant voltage $V_C$ at two times the battery voltage $V_{BAT}$. The supply voltage circuit 62 includes a multi-voltage circuit 78 configured to generate the supply voltages $V_{batampH}$, $V_{batampM}$, and $V_{batampL}$ based on the constant voltage $V_C$. The supply voltage circuit 62 may include a number of holding capacitors $C_H$, $C_M$, and $C_L$ configured to maintain the supply voltages $V_{batampH}$, $V_{batampM}$, and $V_{batampL}$, respectively.

The voltage selection circuit 68 includes a multiplexer 80 configured to receive the supply voltages $V_{batampH}$, $V_{batampM}$, and $V_{batampL}$ from the supply voltage circuit 62. The multiplexer 80 may be controlled by a voltage selection signal 81 to selectively output one of the supply voltages $V_{batampH}$, $V_{batampM}$, and $V_{batampL}$ as the constant auxiliary voltage $V_{CCC}$. The voltage selection circuit 68 may include a low-dropout (LDO) regulator 82 coupled between the multiplexer 80 and the third auxiliary port AUX-C. The LDO regulator 82 can be configured to receive and output the constant auxiliary voltage $V_{CCC}$ to the third auxiliary port AUX-C.

With reference back to FIG. 1, the first auxiliary interface circuit 64 is coupled to the first auxiliary port AUX-A, the second auxiliary port AUX-B, and the third auxiliary port AUX-C to receive the first ET voltage $V_{CCA}$, the second ET voltage $V_{CCB}$, and the constant auxiliary voltage $V_{CCC}$, respectively. The first auxiliary interface circuit 64 includes a number of switches $S_{A1}$, $S_{B1}$, and $S_{C1}$ configured to couple/decouple the first auxiliary port AUX-A, the second auxiliary port AUX-B, and the third auxiliary port AUX-C to/from a first common port $C_A$. In this regard, the first auxiliary interface circuit 64 may be controlled to selectively output one of the first ET voltage $V_{CCA}$, the second ET voltage $V_{CCB}$, and the constant auxiliary voltage $V_{CCC}$ as the first auxiliary voltage $V_{AUX1}$ at the first common port $C_A$ and thus to the first auxiliary amplifier circuit 16.

Similarly, the second auxiliary interface circuit 66 is coupled to the first auxiliary port AUX-A, the second auxiliary port AUX-B, and the third auxiliary port AUX-C to receive the first ET voltage $V_{CCA}$, the second ET voltage $V_{CCB}$, and the constant auxiliary voltage $V_{CCC}$, respectively. The second auxiliary interface circuit 66 includes a number of switches $S_{A2}$, $S_{B2}$, and $S_{C2}$ configured to couple/decouple the first auxiliary port AUX-A, the second auxiliary port AUX-B, and the third auxiliary port AUX-C to/from a second common port CB. In this regard, the second auxiliary interface circuit 66 may be controlled to selectively output one of the first ET voltage $V_{CCA}$, the second ET voltage $V_{CCB}$, and the constant auxiliary voltage $V_{CCC}$ as the second auxiliary voltage $V_{AUX2}$ at the second common port CB and thus to the second auxiliary amplifier circuit 18.

The first MCP 70 is coupled to the supply voltage circuit 62 to receive the supply voltages $V_{batampH}$, $V_{batampM}$, and $V_{batampL}$. The first MCP 70 may be configured to selectively output one of the supply voltages $V_{batampH}$, $V_{batampM}$, and $V_{batampL}$ as a first direct current voltage $V_{DC1}$. Similarly, the second MCP 72 is coupled to the supply voltage circuit 62 to receive the supply voltages $V_{batampH}$, $V_{batampM}$, and $V_{batampL}$. The second MCP 72 may be configured to selectively output one of the supply voltages $V_{batampH}$, $V_{batampM}$, and $V_{batampL}$ as a second direct current voltage $V_{DC2}$.

Figure 3:
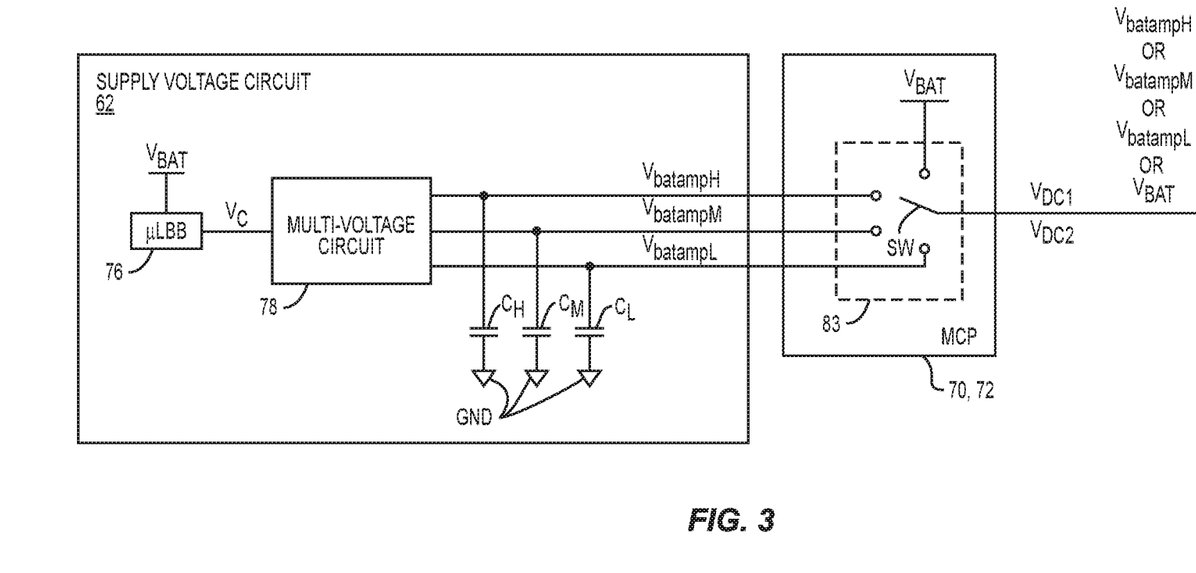
FIG. 3 is a schematic diagram providing an exemplary illustration of a pair of multi-level charge pumps (MCPs) in the ET amplifier apparatus of FIG. 1, which are configured to operate based on the supply voltage circuit of FIG. 2.

FIG. 3 is a schematic diagram providing an exemplary illustration of the first MCP 70 and the second MCP 72 in the ET amplifier apparatus 10 of FIG. 1, which are configured to operate based on the supply voltage circuit 62 of FIG. 2. Common elements between FIGS. 1, 2, and 3 are shown therein with common element numbers and will not be re-described herein.

The first MCP 70 and the second MCP 72 each include switching circuitry 83 coupled to the supply voltage circuit 62. The switching circuitry 83 may include a switch SW, which may be controlled to selectively output one of the battery voltage $V_{BAT}$ and the supply voltages $V_{batampH}$, $V_{batampM}$, and $V_{batampL}$ as the first direct current voltage $V_{DC1}$ and the second direct current voltage $V_{DC2}$. By sharing the supply voltage circuit 62 between the voltage selection circuit 68, the first MCP 70, and the second MCP 72, it may be possible to reduce footprint of the ETIC 48, which may further lead to a reduction in footprint of the ET amplifier apparatus 10.

With reference back to FIG. 1, the ETIC 48 may include a first inductor 84 and a second inductor 86. The first inductor 84 is coupled between the first MCP 70 and the first amplifier circuit 12 and configured to induce a first low-frequency current $I_{DC1}$ (e.g., a direct current) based on the first direct current voltage $V_{DC1}$. The second inductor 86 is coupled between the second MCP 72 and the second amplifier circuit 14 and configured to induce a second low-frequency current $I_{DC2}$ (e.g., a direct current) based on the second direct current voltage $V_{DC2}$.

The target voltage circuit 74 is configured to generate the first ET target voltage $V_{TARGETA}$ and the second ET target voltage $V_{TARGETB}$ based on a target voltage signal 88. Please refer to U.S. patent application Ser. No. 16/267,740, entitled "DISTRIBUTED ENVELOPE TRACKING AMPLIFIER CIRCUIT AND RELATED APPARATUS," filed on Feb. 5, 2019, for an exemplary implementation of the target voltage circuit 74. Accordingly, the target voltage circuit 74 can be configured to provide the first ET target voltage $V_{TARGETA}$ and the second ET target voltage $V_{TARGETB}$ to the first amplifier circuit 12 and the second amplifier circuit 14, respectively. It should be appreciated that the target voltage circuit 74 may be moved from the ETIC 48 into the distributed ET amplifier circuit 42 to help reduce possible trace-inductance related distortion in the first ET target voltage $V_{TARGETA}$ and the second ET target voltage $V_{TARGETB}$.

The ETIC 48 can be configured to include a controller 90, which can be a microprocessor, a microcontroller, or a field-programmable gate array (FPGA) for example. The controller 90 may be coupled to the supply voltage circuit 62, the first auxiliary interface circuit 64, the second auxiliary interface circuit 66, the voltage selection circuit 68, the first MCP 70, the second MCP 72, and/or the target voltage circuit 74. The controller 90 may also control the supply voltage circuit 62 to generate the supply voltages $V_{batampH}$, $V_{batampM}$, and $V_{batampL}$ based on the battery voltage $V_{BAT}$. Accordingly, the controller 90 may provide the voltage selection signal 81 to selectively output the constant auxiliary voltage $V_{CCC}$ to the third auxiliary port AUX-C. The controller 90 may further control the first auxiliary interface circuit 64 and/or the second auxiliary interface circuit 66 to selectively output the first auxiliary voltage $V_{AUX1}$ and/or the second auxiliary voltage $V_{AUX2}$ based on the first ET voltage $V_{CCA}$, the second ET voltage $V_{CCB}$, and the constant auxiliary voltage $V_{CCC}$.

The distributed ET amplifier circuit 42 may include a distributed controller 92, which can be a microprocessor, a microcontroller, or a FPGA for example. In a non-limiting example, the controller 90 can function as a master controller and the distributed controller 92 can function as a slave controller. The distributed controller 92 may be communicatively coupled to the controller 90 via an RF front-end (RFFE) interface 94. Accordingly, the controller 90 and distributed controller 92 may exchange commands via the RFFE interface 94. In one example, the controller 90 can instruct the distributed controller 92 to activate or deactivate any one of the first amplifier circuit 12 and the second amplifier circuit 14. In another example, the distributed controller 92 may independently activate or deactivate any one of the first amplifier circuit 12 and the second amplifier circuit 14. Accordingly, the distributed controller 92 may notify the controller 90 as to the amplifier circuits being activated or deactivated. Further, the distributed controller 92 may control the first ET circuit 44 and/or the second ET circuit 46 to provide the first ET voltage $V_{CCA}$ and/or the second ET voltage $V_{CCB}$ to the first amplifier circuit 12 and/or the second amplifier circuit 14.

In a non-limiting example, the first amplifier circuit 12 and/or the second amplifier circuit 14 can be a three-stage amplifier circuit that includes a first-stage amplifier S1, a second-stage amplifier S2, and a third-stage amplifier S3. In this regard, the distributed ET amplifier circuit 42 may be configured to include a distributed voltage selection circuit 96, which may be implemented according to a similar configuration as the voltage selection circuit 68 in FIG. 2. The distributed voltage selection circuit 96 may be configured to receive the supply voltages $V_{batampH}$, $V_{batampM}$, and $V_{batampL}$. The distributed voltage selection circuit 96 may receive a second voltage selection signal 98, which may be generated by the distributed controller 92. Accordingly, the distributed voltage selection circuit 96 may selectively output a selected supply voltage Vs among the supply voltages $V_{batampH}$, $V_{batampM}$, and $V_{batampL}$ to the first-stage amplifier S1.

To support concurrent MIMO operation in the first RF band and the second RF band, the controller 90 and/or the distributed controller 92 may be configured to concurrently activate the first amplifier circuit 12, the second amplifier circuit 14, the first auxiliary amplifier circuit 16, and the second auxiliary amplifier circuit 18. Accordingly, the controller 90 may cause the first ET circuit 44 and the second ET circuit 46 to provide the first ET voltage $V_{CCA}$ and the second ET voltage $V_{CCB}$ to the first amplifier circuit 12 and the second amplifier circuit 14, respectively. Further, the controller 90 may close the switches $S_{C1}$ and $S_{C2}$, while opening the switches $S_{A1}$, $S_{B1}$, $S_{A2}$, and $S_{B2}$, to provide the constant auxiliary voltage $V_{CCC}$ to the first auxiliary amplifier circuit 16 and the second auxiliary amplifier circuit 18 as the first auxiliary voltage $V_{AUX1}$ and the second auxiliary voltage $V_{AUX2}$.

Figure 4:
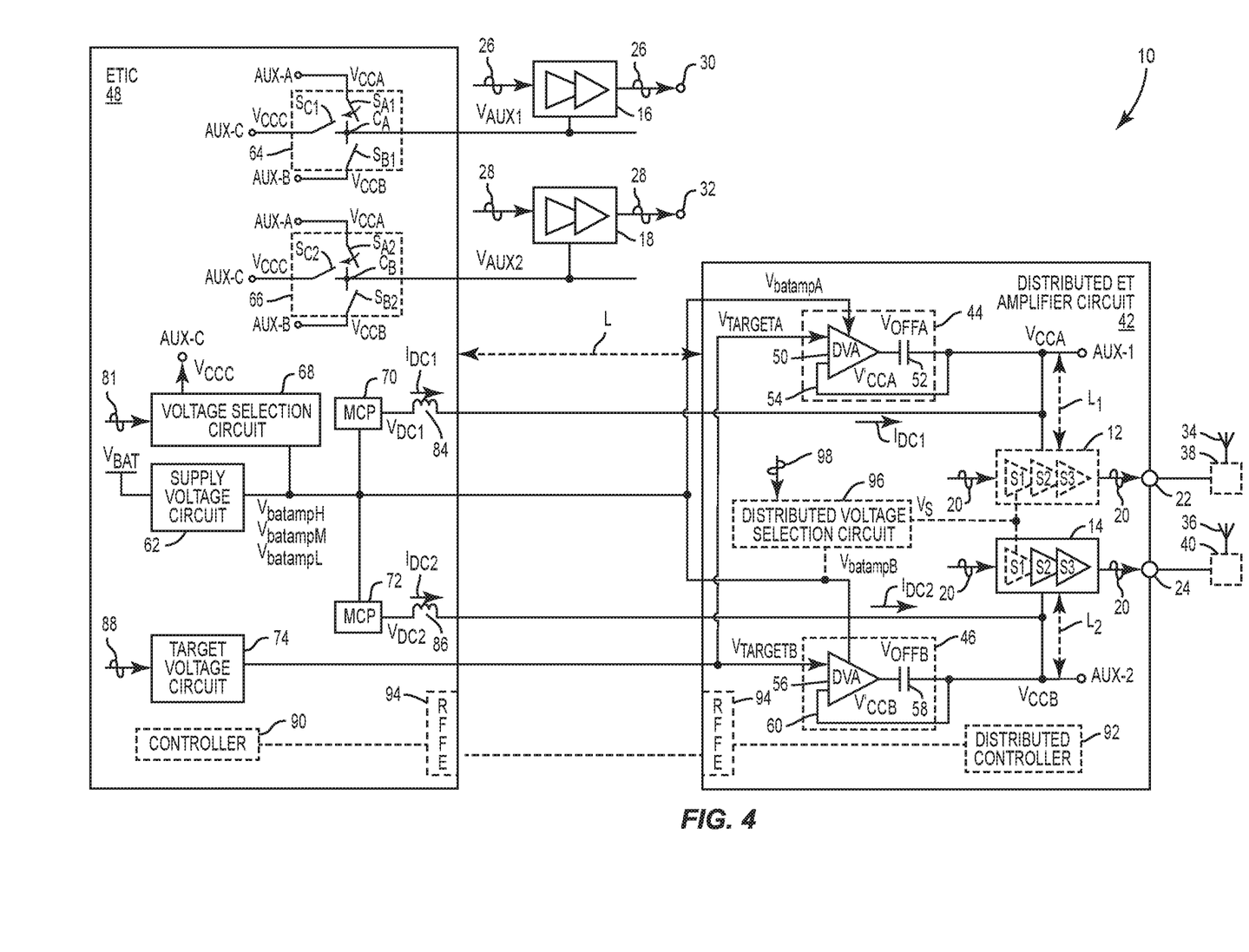
FIG. 4 is a schematic diagram providing an exemplary illustration of the ET amplifier apparatus of FIG. 1 configured according to another embodiment of the present disclosure to support concurrent transmission in multiple RF bands.

Notably, the ET amplifier apparatus 10 may be flexibly reconfigured to support non-MIMO operation. In this regard, FIG. 4 is a schematic diagram providing an exemplary illustration of the ET amplifier apparatus 10 of FIG. 1 configured according to another embodiment of the present disclosure to support concurrent transmission in multiple RF bands. Common elements between FIGS. 1 and 4 are shown therein with common element numbers and will not be re-described herein.

In a non-limiting example, the controller 90 and/or the distributed controller 92 may determine that the second amplifier circuit 14, the first auxiliary amplifier circuit 16, and the second auxiliary amplifier circuit 18 are activated, while the first amplifier circuit 12 is deactivated. In this regard, the controller 90 may close the switches $S_{A1}$ and $S_{A2}$, while opening the switches $S_{B1}$, $S_{C1}$, $S_{B2}$, and $S_{C2}$ in the first auxiliary interface circuit 64 and the second auxiliary interface circuit 66. Accordingly, the first auxiliary amplifier circuit 16 and the second auxiliary amplifier circuit 18 receive the first ET voltage $V_{CCA}$ as the first auxiliary voltage $V_{AUX1}$ and the second auxiliary voltage $V_{AUX2}$.

Figure 5:
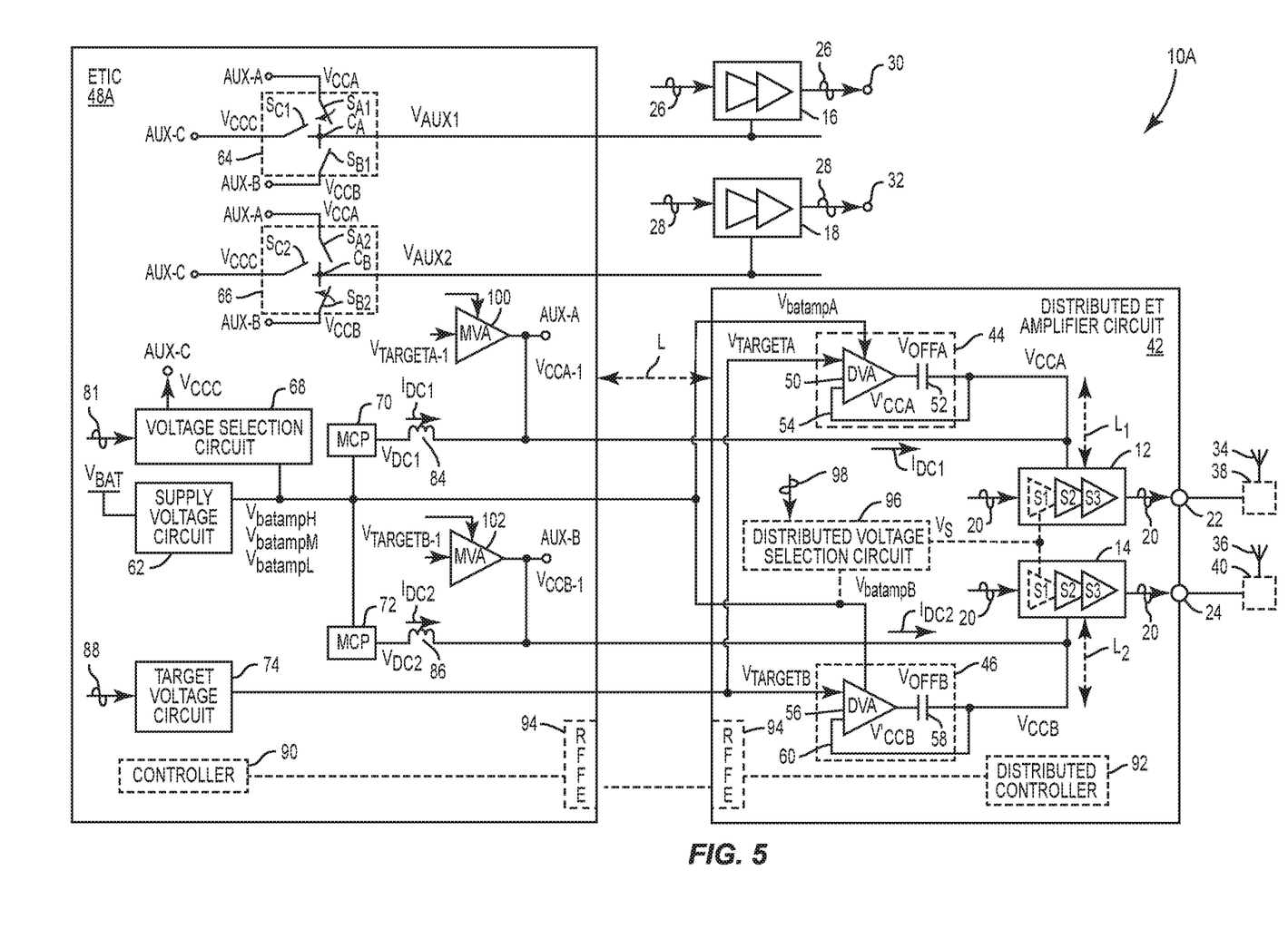
FIG. 5 is a schematic diagram of an exemplary ET amplifier apparatus configured according to an alternative embodiment of the present disclosure.

FIG. 5 is a schematic diagram of an exemplary ET amplifier apparatus 10A configured according to an alternative embodiment of the present disclosure. Common elements between FIGS. 1 and 5 are shown therein with common element numbers and will not be re-described herein.

The ET amplifier apparatus 10A includes an ETIC 48A. The ETIC 48A includes a first main voltage amplifier 100 (denoted as "MVA") and a second main voltage amplifier 102, which may be functionally equivalent to the first distributed voltage amplifier 50 and the second distributed voltage amplifier 56, respectively. The first main voltage amplifier 100 is coupled to the first auxiliary port AUX-A and configured to generate a first ET auxiliary voltage $V_{CCA-1}$ at the first auxiliary port AUX-A based on a first main ET target voltage $V_{TARGETA-1}$. The second main voltage amplifier 102 is coupled to the second auxiliary port AUX-B and configured to generate a second ET auxiliary voltage $V_{CCB-1}$ at the second auxiliary port AUX-B based on a second main ET target voltage $V_{TARGETB-1}$.

In a non-limiting example, the first amplifier circuit 12, the second amplifier circuit 14, the first auxiliary amplifier circuit 16, and the second auxiliary amplifier circuit 18 are all activated to support concurrent MIMO transmissions in the first RF band and the second RF band. In this regard, the first ET circuit 44 and the second ET circuit 46 are configured to provide the first ET voltage $V_{CCA}$ and the second ET voltage $V_{CCB}$ to the first amplifier circuit 12 and the second amplifier circuit 14, respectively.

The controller 90 may close the switches $S_{A1}$ and $S_{B2}$, while opening the switches $S_{B1}$, $S_{C1}$, $S_{A2}$, and $S_{C2}$. Accordingly, the first auxiliary amplifier circuit 16 receives the first ET auxiliary voltage $V_{CCA-1}$ as the first auxiliary voltage $V_{AUX1}$ and the second auxiliary amplifier circuit 18 receives the second ET auxiliary voltage $V_{CCA-2}$ as the second auxiliary voltage $V_{AUX2}$.

Figure 6:
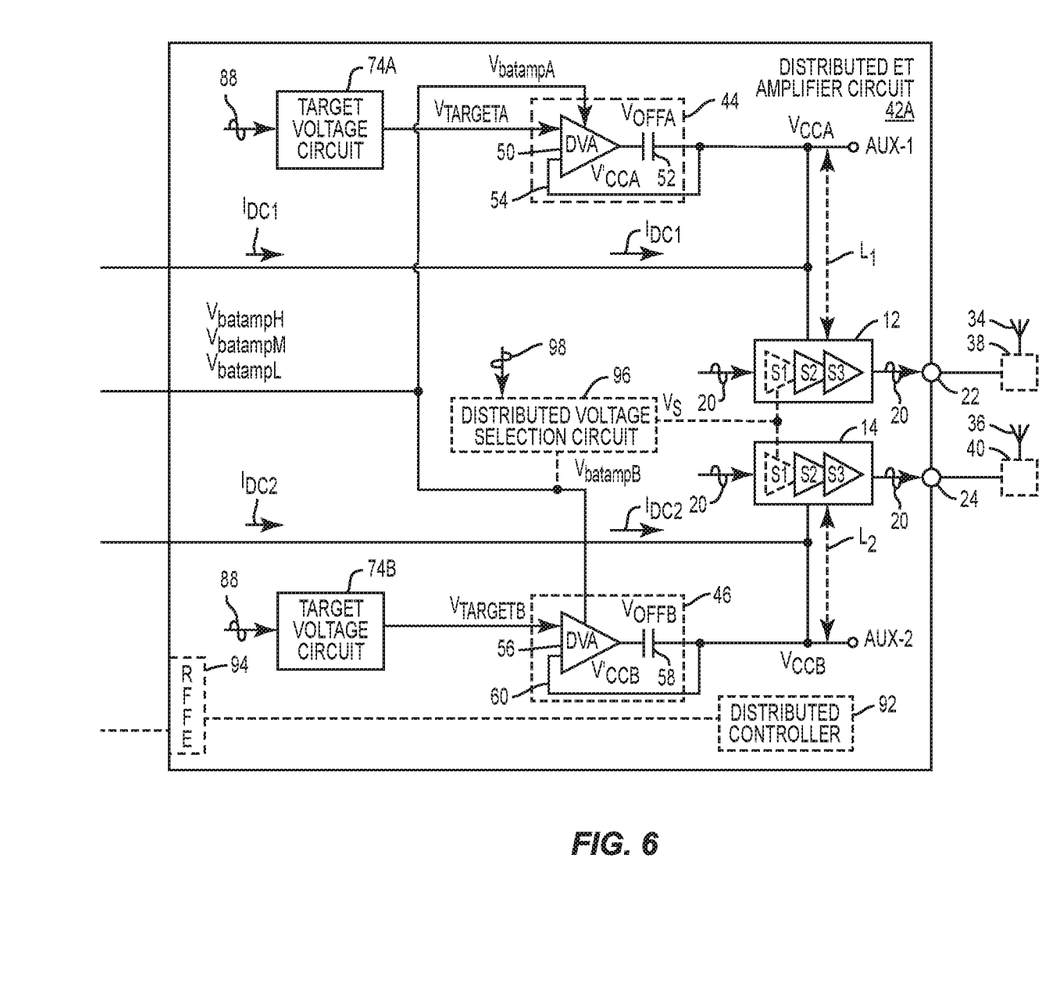
FIG. 6 is a schematic diagram of an exemplary distributed ET amplifier circuit configured according to an embodiment of the present disclosure and can be provided in the ET amplifier apparatus of FIGS. 1, 4, and 5.

FIG. 6 is a schematic diagram of an exemplary distributed amplifier circuit 42A configured according to an embodiment of the present disclosure and can be provided in the ET amplifier apparatus 10 of FIGS. 1, 4, and 5. Common elements between FIGS. 1 and 6 are shown therein with common element numbers and will not be re-described herein.

The distributed amplifier circuit 42A includes a first target voltage circuit 74A and a second target voltage circuit 74B configured to generate the first ET target voltage $V_{TARGETA}$ and the second ET target voltage $V_{TARGETB}$, respectively, based on the target voltage signal 88. Each of the first target voltage circuit 74A and the second target voltage circuit 74B may be functionally equivalent to the target voltage circuit 74 in the ET amplifier apparatus 10 of FIGS. 1, 4, and 5.

Figure 7:
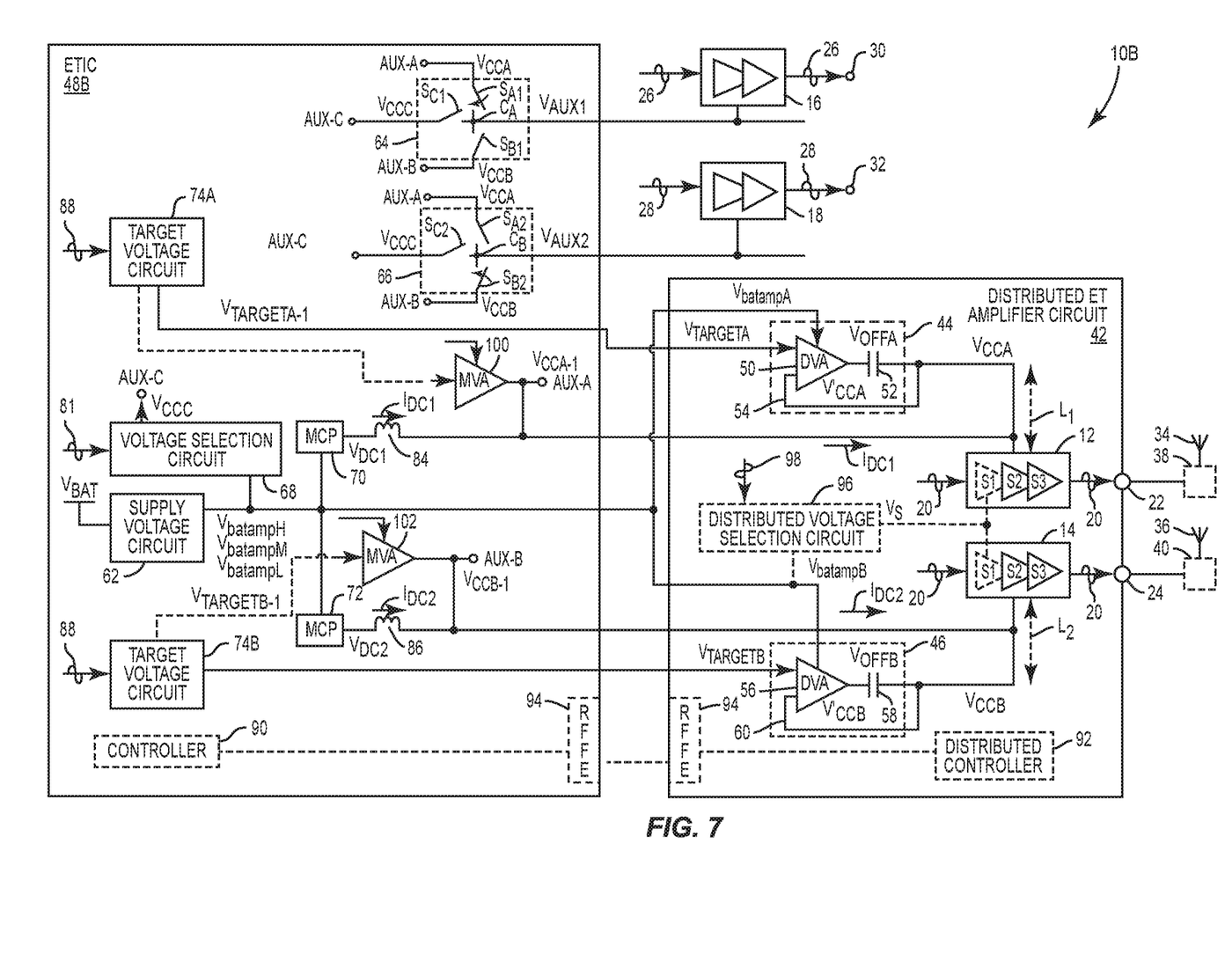
FIG. 7 is a schematic diagram of an exemplary ET amplifier apparatus configured according to another embodiment of the present disclosure.

FIG. 7 is a schematic diagram of an exemplary ET amplifier apparatus 10B configured according to an embodiment of the present disclosure. Common elements between FIGS. 5 and 7 are shown therein with common element numbers and will not be re-described herein.

The ET amplifier apparatus 10B includes an ETIC 48B. The ETIC 48B includes a first target voltage circuit 74A and a second target voltage circuit 74B. The first target voltage circuit 74A and the second target voltage circuit 74B are configured to generate the first ET target voltage $V_{TARGETA}$ and the second ET target voltage $V_{TARGETB}$ for the first distributed voltage amplifier 50 and the second distributed voltage amplifier 56, respectively, based on the target voltage signal 88. The first target voltage circuit 74A and the second target voltage circuit 74B may be further configured to generate a first main ET target voltage $V_{TARGETA\text{-}1}$ and a second main ET target voltage $V_{TARGETB\text{-}1}$ for the first main voltage amplifier 100 and the second main voltage amplifier 102, respectively, based on the target voltage signal 88. In a non-limiting example, the first target voltage circuit 74A can be configured to generate the first ET target voltage $V_{TARGETA}$ and the first main ET target voltage $V_{TARGETA\text{-}1}$ individually or concurrently. Likewise, the second target voltage circuit 74B can be configured to generate the second ET target voltage $V_{TARGETB}$ and the second main ET target voltage $V_{TARGETB\text{-}1}$ individually or concurrently.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) amplifier apparatus comprising:
    a distributed ET amplifier circuit comprising:
        a first amplifier circuit configured to amplify a radio frequency (RF) signal based on a first ET voltage;
        a first ET circuit configured to generate the first ET voltage;
        a second amplifier circuit configured to amplify the RF signal based on a second ET voltage; and
        a second ET circuit configured to generate the second ET voltage;
    a first auxiliary amplifier circuit configured to amplify a first RF signal based on a first auxiliary voltage;
    a second auxiliary amplifier circuit configured to amplify a second RF signal based on a second auxiliary voltage; and
    an ET integrated circuit (ETIC) configured to:
        cause at least one ET circuit among the first ET circuit and the second ET circuit to provide at least one ET voltage among the first ET voltage and the second ET voltage to at least one amplifier circuit among the first amplifier circuit and the second amplifier circuit in response to determining that the at least one amplifier circuit is activated; and
        provide at least one auxiliary voltage among the first auxiliary voltage and the second auxiliary voltage to at least one auxiliary amplifier circuit among the first auxiliary amplifier circuit and the second auxiliary amplifier circuit in response to determining that the at least one auxiliary amplifier circuit is activated.

2. The ET amplifier apparatus of claim 1 wherein the distributed ET amplifier circuit further comprises a first target voltage circuit and a second target voltage circuit configured to generate a first ET target voltage and a second ET target voltage for the first ET circuit and the second ET circuit, respectively.

3. The ET amplifier apparatus of claim 1 wherein the ETIC comprises:
    a supply voltage circuit configured to generate a plurality of supply voltages based on a battery voltage;
    a first auxiliary interface circuit configured to:
        receive a constant auxiliary voltage, a first ET auxiliary voltage, and a second ET auxiliary voltage;
        determine the first auxiliary voltage among the constant auxiliary voltage, the first ET auxiliary voltage, and the second ET auxiliary voltage; and
        provide the first auxiliary voltage to the first auxiliary amplifier circuit;
    a second auxiliary interface circuit configured to:
        receive the constant auxiliary voltage, the first ET auxiliary voltage, and the second ET auxiliary voltage;
        determine the second auxiliary voltage among the constant auxiliary voltage, the first ET auxiliary voltage, and the second ET auxiliary voltage; and
        provide the second auxiliary voltage to the second auxiliary amplifier circuit; and
    a voltage selection circuit coupled to the supply voltage circuit and configured to:
        select the constant auxiliary voltage among the plurality of supply voltages; and
        provide the constant auxiliary voltage to the first auxiliary interface circuit and the second auxiliary interface circuit.

4. The ET amplifier apparatus of claim 3 wherein the voltage selection circuit comprises:
    a multiplexer configured to receive the plurality of supply voltages from the supply voltage circuit and selectively output the constant auxiliary voltage among the plurality of supply voltages; and
    a low-drop out (LDO) regulator configured to receive and output the constant auxiliary voltage.

5. The ET amplifier apparatus of claim 3 wherein the ETIC further comprises:
    a first multi-level charge pump (MCP) coupled to the supply voltage circuit and configured to selectively output a first direct current voltage among the plurality of supply voltages and the battery voltage;
    a second MCP coupled to the supply voltage circuit and configured to selectively output a second direct current voltage among the plurality of supply voltages and the battery voltage; and
    a target voltage circuit configured to generate a first ET target voltage and a second ET target voltage for the first ET circuit and the second ET circuit, respectively.

6. The ET amplifier apparatus of claim 5 wherein the target voltage circuit comprises:
    a first target voltage circuit configured to generate the first ET target voltage; and
    a second target voltage circuit configured to generate the second ET target voltage.

7. The ET amplifier apparatus of claim 5 wherein the first MCP comprises switching circuitry coupled to the supply voltage circuit and configured to selectively output the first direct current voltage among the plurality of supply voltages and the battery voltage.

8. The ET amplifier apparatus of claim 5 wherein the second MCP comprises switching circuitry coupled to the supply voltage circuit and configured to selectively output the second direct current voltage among the plurality of supply voltages and the battery voltage.

9. The ET amplifier apparatus of claim 5 wherein the ETIC further comprises:
    a first inductor coupled between the first MCP and the first amplifier circuit and configured to:
        induce a first low-frequency current based on the first direct current voltage; and provide the first low-frequency current to the first amplifier circuit; and a second inductor coupled between the second MCP and the second amplifier circuit and configured to:
induce a second low-frequency current based on the second direct current voltage; and
provide the second low-frequency current to the second amplifier circuit.

10. The ET amplifier apparatus of claim 5 wherein:
the first ET circuit comprises a first distributed voltage amplifier configured to:
receive the plurality of supply voltages from the supply voltage circuit;
receive the first ET target voltage from the target voltage circuit; and
generate a first initial ET voltage based on the plurality of supply voltages and the first ET target voltage; and
the second ET circuit comprises a second distributed voltage amplifier configured to:
receive the plurality of supply voltages from the supply voltage circuit;
receive the second ET target voltage from the target voltage circuit; and
generate a second initial ET voltage based on the plurality of supply voltages and the second ET target voltage.

11. The ET amplifier apparatus of claim 10 wherein:
the first ET circuit further comprises a first offset capacitor coupled between the first distributed voltage amplifier and the first amplifier circuit, the first offset capacitor configured to raise the first initial ET voltage by a first offset voltage to generate the first ET voltage; and
the second ET circuit further comprises a second offset capacitor coupled between the second distributed voltage amplifier and the second amplifier circuit, the second offset capacitor configured to raise the second initial ET voltage by a second offset voltage to generate the second ET voltage.

12. The ET amplifier apparatus of claim 3 wherein:
each of the first amplifier circuit and the second amplifier circuit comprises a first-stage amplifier, a second-stage amplifier, and a third-stage amplifier; and
the distributed ET amplifier circuit further comprises a distributed voltage selection circuit configured to:
receive the plurality of supply voltages from the supply voltage circuit; and
determine and provide a selected supply voltage among the plurality of supply voltages to the first-stage amplifier in the first amplifier circuit and the second amplifier circuit.

13. The ET amplifier apparatus of claim 3 wherein the ETIC further comprises a controller configured to:
control the supply voltage circuit configured to generate the plurality of supply voltages based on the battery voltage;
control the first auxiliary interface circuit configured to selectively output the first auxiliary voltage among the constant auxiliary voltage, the first ET voltage, and the second ET voltage;
control the second auxiliary interface circuit to selectively output the second auxiliary voltage among the constant auxiliary voltage, the first ET voltage, and the second ET voltage; and
control the voltage selection circuit coupled to selectively provide the constant auxiliary voltage to the first auxiliary interface circuit and the second auxiliary interface circuit.

14. The ET amplifier apparatus of claim 13 wherein the distributed ET amplifier circuit further comprises a distributed controller communicatively coupled to the controller and configured to:
determine the at least one amplifier circuit that is activated; and
control the at least one ET circuit to provide the at least one ET voltage to the at least one amplifier circuit in response to determining that the at least one amplifier circuit is activated.

15. The ET amplifier apparatus of claim 14 wherein the distributed controller is communicatively coupled to the controller via one or more RF front-end (RFFE) interfaces.

16. The ET amplifier apparatus of claim 1 wherein the ETIC is further configured to:
determine that the first amplifier circuit, the second amplifier circuit, the first auxiliary amplifier circuit, and the second auxiliary amplifier circuit are concurrently activated;
cause the first ET circuit and the second ET circuit to provide the first ET voltage and the second ET voltage to the first amplifier circuit and the second amplifier circuit, respectively; and
provide the first auxiliary voltage and the second auxiliary voltage to the first auxiliary amplifier circuit and the second auxiliary amplifier circuit, respectively.

17. The ET amplifier apparatus of claim 1 wherein the ETIC is further configured to:
determine that the second amplifier circuit, the first auxiliary amplifier circuit, and the second auxiliary amplifier circuit are concurrently activated while the first amplifier circuit is deactivated;
cause the second ET circuit to provide the second ET voltage to the second amplifier circuit; and
cause the first ET circuit to provide the first ET voltage to the first auxiliary amplifier circuit and the second auxiliary amplifier circuit.

18. The ET amplifier apparatus of claim 1 wherein the ETIC comprises:
a first main voltage amplifier configured to generate a first ET auxiliary voltage based on a first main ET target voltage; and
a second main voltage amplifier configured to generate a second ET auxiliary voltage based on a second main ET target voltage.

19. The ET amplifier apparatus of claim 18 wherein the ETIC is further configured to:
determine that the first amplifier circuit, the second amplifier circuit, the first auxiliary amplifier circuit, and the second auxiliary amplifier circuit are concurrently activated;
cause the first ET circuit and the second ET circuit to provide the first ET voltage and the second ET voltage to the first amplifier circuit and the second amplifier circuit, respectively; and
activate the first main voltage amplifier and the second main voltage amplifier to provide the first ET auxiliary voltage and the second ET auxiliary voltage to the first auxiliary amplifier circuit and the second auxiliary amplifier circuit, respectively.

20. The ET amplifier apparatus of claim 18 wherein the ETIC further comprises a first target voltage circuit and a second target voltage circuit configured to generate the first main ET target voltage and the second main ET target voltage, respectively.

* * * * *